(12) United States Patent
Lee et al.

(10) Patent No.: US 8,716,108 B2
(45) Date of Patent: May 6, 2014

(54) INTEGRATED CIRCUIT PACKAGING SYSTEM WITH ULTRA-THIN CHIP AND METHOD OF MANUFACTURE THEREOF

(75) Inventors: Hun Teak Lee, Seongnam-si (KR); DaeWook Yang, Yongin-si (KR); Yeongbeom Ko, Suwon-si (KR)

(73) Assignee: Stats Chippac Ltd., Singapore (SG)

( * ) Notice: Subject to any disclaimer, the term of this patent is extended or adjusted under 35 U.S.C. 154(b) by 52 days.

(21) Appl. No.: 13/426,529

(22) Filed: Mar. 21, 2012

(65) Prior Publication Data

US 2013/0249117 A1    Sep. 26, 2013

(51) Int. Cl.
*H01L 21/30*      (2006.01)
*H01L 21/46*      (2006.01)

(52) U.S. Cl.
USPC .... 438/459; 438/118; 438/977; 257/E23.001; 257/E21.514; 257/E21.567

(58) Field of Classification Search
USPC .......... 438/106, 118, 459, 977; 257/E23.001, 257/E21.514, E21.567
See application file for complete search history.

(56) References Cited

U.S. PATENT DOCUMENTS

| | | | |
|---|---|---|---|
| 6,699,735 B2 * | 3/2004 | Ohuchi et al. | 438/113 |
| 8,003,441 B2 | 8/2011 | Maeda et al. | |
| 2007/0004180 A1 * | 1/2007 | Abe | 438/460 |
| 2010/0015782 A1 * | 1/2010 | Yu et al. | 438/463 |

* cited by examiner

*Primary Examiner* — Michelle Mandala
(74) *Attorney, Agent, or Firm* — Ishimaru & Associates LLP

(57) ABSTRACT

A method of manufacture of an integrated circuit packaging system includes: providing a circuit substrate having an active side opposite to an inactive portion; attaching a nonconductive cover to the active side; forming a separation-gap partially cutting into the nonconductive cover and the circuit substrate to a kerf depth; attaching a back-grinding tape to the nonconductive cover; removing a portion of the inactive portion; and exposing the nonconductive cover by removing the back-grinding tape.

14 Claims, 4 Drawing Sheets ial circuit packaging
system, and more particularly to a system
having ultra-thin integrated circuit.

INTEGRATED CIRCUIT PACKAGING SYSTEM WITH ULTRA-THIN CHIP AND METHOD OF MANUFACTURE THEREOF

TECHNICAL FIELD

The present invention relates generally to an integrated circuit packaging system, and more particularly to a system having ultra-thin integrated circuit.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner.

Thus, a need still remains for an integrated circuit packaging system providing low cost manufacturing, improved yields, reduction of integrated circuit package dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a circuit substrate having an active side opposite to an inactive portion; attaching a nonconductive cover to the active side; forming a separation-gap partially cutting into the nonconductive cover and the circuit substrate to a kerf depth; attaching a back-grinding tape to the nonconductive cover; removing a portion of the inactive portion; and exposing the nonconductive cover by removing the back-grinding tape.

The present invention provides an integrated circuit packaging system including: a substrate; an integrated circuit die mounted over the substrate; a die connector directly contacting the integrated circuit die and the substrate; and a non-conductive layer between the substrate and the integrated circuit die with the non-conductive layer including perimeter surfaces of the non-conductive layer having non-concave shape along a perimeter of the integrated circuit die.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
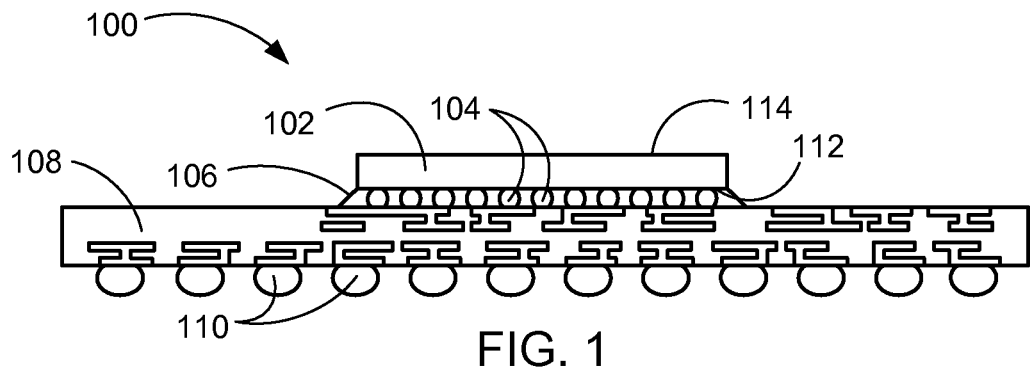
FIG. 1 is an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of an active side of the integrated circuit, regardless of its orientation. The active side is defined as a surface of an integrated circuit device having active circuitry fabricated thereon. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements. The term "processing" as used herein includes deposition of material, patterning, exposure, development, etching, cleaning, molding, and/or removal of the material or as required in forming a described structure.

Referring now to FIG. 1, therein is shown an integrated circuit packaging system 100 in an embodiment of the present invention. The integrated circuit packaging system 100 can have an integrated circuit die 102, die connectors 104, a non-conductive layer 106, a substrate 108, and package interconnects 110.

The integrated circuit die 102 can be a flip chip. The integrated circuit die 102 can have an active side 112 having active circuitry fabricated thereon and a passive side 114 opposite the active side 112.

The die connectors 104 can be conductive material used to directly contact and electrically couple the integrated circuit die 102 to other components. As an example, the die connectors 104 can be solder bumps, conductive posts, conductive columns, or a combination thereof. The die connectors 104 can be metallic material, such as lead, silver, or tin. The die connectors 104 can also be formed from a metal alloy. The die connectors 104 can be attached to the active side 112 of the integrated circuit die 102 and arranged to form a ball-grid array.

The die connectors 104 can be within the non-conductive layer 106. The non-conductive layer 106 can be made from a film, a paste, or resin type of material that does not conduct electricity.

The non-conductive layer 106 can contact and surround the die connectors 104 and electrically isolate each of the die connectors 104. The non-conductive layer 106 can be between the active side 112 of the integrated circuit die 102 and the substrate 108. The non-conductive layer 106 can directly contact the active side 112, the die connectors 104, the substrate 108, or a combination thereof.

The non-conductive layer 106 can encapsulate the die connectors 104. The non-conductive layer 106 can have uniform consistency therein. The nonconductive layer 106 can contact the active side 112, the die connectors 104, a portion of the substrate 108 under the integrated circuit die 102, or a combination thereof. The non-conductive layer 106 can fill up empty spaces between the active side 112 and the substrate 108, and around the die connectors 104 and not have any gaps or voids. The method for forming the non-conductive layer 106 will be discussed in detail below.

The substrate 108 can be different types, such as laminate substrate or ceramic substrate. The substrate 108 can have the integrated circuit die 102 attached on a top surface of the substrate 108 and the package interconnects 110 attached on a bottom surface of the substrate 108. The package interconnects 110 can be metallic material, such as copper, silver, or zinc. The package interconnects 110 can also be formed from a metal alloy.

Figure 2:
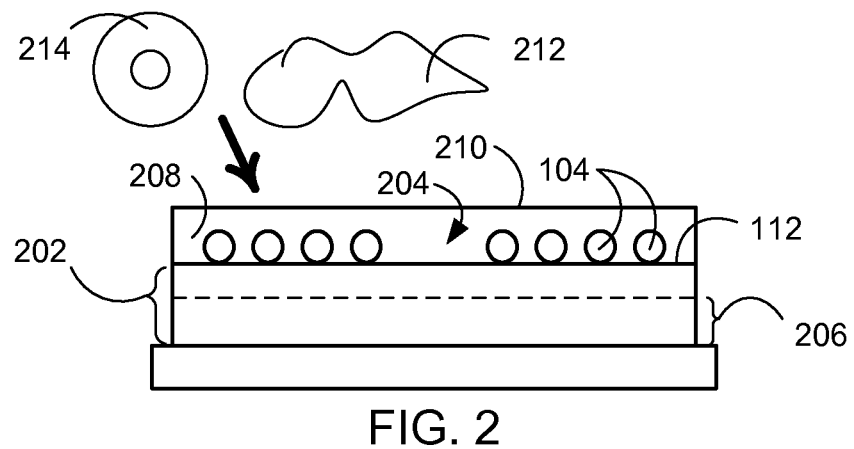
FIG. 2 is a cross-sectional view of components arranged for manufacturing of the integrated circuit die of FIG. 1.

Referring now to FIG. 2, therein is shown a cross-sectional view of components arranged for manufacturing of the integrated circuit die 102 of FIG. 1. The manufacturing process can include providing a circuit substrate 202.

The circuit substrate 202 is defined as semiconductor material used to fabricate integrated circuits or micro-devices. The circuit substrate 202 can be used to fabricate the integrated circuit die 102 of FIG. 1. For example, the circuit substrate 202 can be a silicon wafer or a structure made of various materials, such as ceramic or composite material. Also, for example, the circuit substrate 202 can have gates, redistribution layer, low-dielectric layer, contact pads, or a combination thereof.

The circuit substrate 202 can be arranged having the active side 112 on top. The active side 112 can be connected to the die connectors 104 as described above. The die connectors 104 can be arranged to form a ball-grid-array. The die connectors 104 can also be grouped according to the designed location and arrangement for forming the semiconductor devices.

For example, the die connectors 104 can be grouped to have four rows on the left portion of the active side 112 and four rows on the right portion of the active side 112. Also, for example, the die connectors 104 can have a device separation portion 204 between groupings of the die connectors 104. The device separation portion 204 can be a portion of the circuit substrate 202 that is between portions intended to become integrated circuit devices.

The circuit substrate 202 can also have an inactive portion 206. The inactive portion 206 of the circuit substrate 202 can be the lower or inactive portion of the circuit substrate 202 that is away from the active side 112. The inactive portion 206 can be opposite to the active side 112. The inactive portion 206 can be the substrate portion of the circuit substrate 202.

The circuit substrate 202 can have a nonconductive cover 208 attached to the inactive side 112. The nonconductive cover 208 can be attached by being pressed, heated, cured, softened, rolled, laminated, applied, or a combination thereof on to the inactive side 112.

The nonconductive cover 208 can have a cover surface 210. The nonconductive cover 208 is defined as a film or a paste made of nonconductive material that can be used to isolate the active side 112, the die connectors 104, or a combination thereof. The nonconductive cover 208 can be used to form the non-conductive layer 106 of FIG. 1.

The nonconductive cover 208 can be a nonconductive paste 212, a nonconductive film 214, or a combination thereof attached to the active side 112. The nonconductive paste 212 and nonconductive film 214 can both be adhesive material, such as resin or epoxy, and are also electrical insulators.

The nonconductive paste 212 can be originally in a liquid or gelatinous form and the nonconductive film 214 can be in a more solidified form, such as a sheet or on a roll, at room temperature, before exposure to air, temperature change, light, chemical reactants, or a combination thereof. The nonconductive paste 212 and the nonconductive film 214 material can become softer or harder based on temperature, exposure to light, chemical reactant, or a combination thereof.

For example, the nonconductive paste 212 and the nonconductive film 214 material can be soft enough to flow and reshape, such as in B-stage material or gelatinous material, in a certain temperature range and becomes more solid, such as a cured epoxy or C-stage material, in a different temperature range. The temperature required to soften the nonconductive film 214 can be between room temperature and below the temperature at which the die connectors 104 becomes soft enough to reflow or reshape. Also for example, exposure to light can fully solidify the nonconductive paste 212 and the nonconductive film 214 and render the material unable to change the rigidity.

The nonconductive paste 212, the nonconductive film 214, or a combination thereof can be heated and applied to the active side 112. The temperature increase can soften the material further and cause the material to form around the die connectors 104 and the active side 112 without leaving any gaps or voids. The heated material can utilize gravity, adhesive trait of the material, or a combination thereof to fully contact all surfaces and leave no gaps or voids. The amount of applied heat can be controlled to be lower than the temperature required to reflow or reshape the die connectors 104.

The nonconductive paste 212, the nonconductive film 214, or a combination thereof can also be attached under a vacuum condition. The nonconductive paste 212, the nonconductive film 214, or a combination thereof can be shaped to fully enclose the die connectors 104 and form the cover surface 210 that is planar above the die connectors 104.

The nonconductive paste 212, the nonconductive film 214, or a combination thereof can be applied, pressed, laminated, such as using a roll laminator, or a combination thereof onto the active side 112 then hardened using temperature variation, reactive agents, light, or a combination thereof. The reaction necessary to harden or soften the nonconductive paste 212 or the nonconductive film 214 can depend on the chemical composition and property of the nonconductive paste 212 or the nonconductive film 214.

The nonconductive cover 208 can include the cover surface 210. The cover surface 210 is defined as a planar surface of the nonconductive cover 208 that is opposite to the active side 112. The cover surface 210 can be a flat planar surface and have good surface conditions for attaching with other tape or adhesive materials. The cover surface 210 can be above the top portions of the die connectors 104 to have the die connectors 104 fully enclosed within the nonconductive cover 208.

The material and structure of the nonconductive cover 208 at the cover surface 210 can have molecular or structural qualities that can easily attach to adhesive tapes. The material and structure of the nonconductive cover 208 at the cover surface 210 can further have molecular or structural qualities can allow removing tapes through a de-taping process without any residue. For example, the cover surface 210 can be smoothed or chemically treated to achieve the material or structural qualities characterized as the good surface conditions.

The nonconductive cover 208 can be clear or transparent. The nonconductive cover 208 can be made of nonconductive material that allows the die connectors 104, the active side 112, or a combination thereof to be visible or detected through the cover surface 210.

Figure 3:
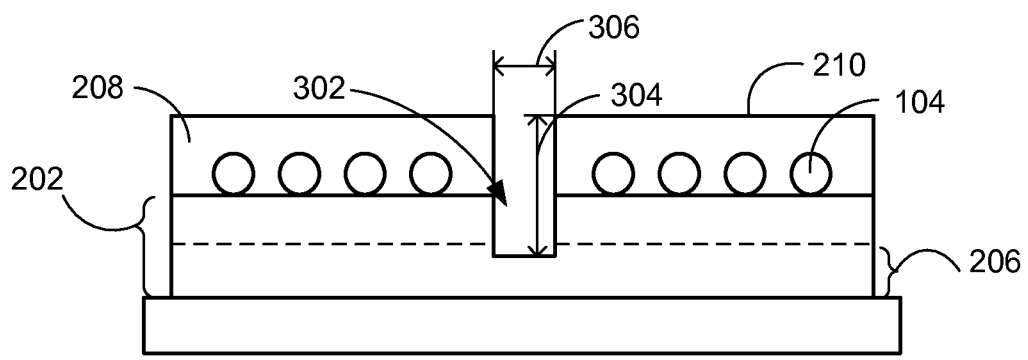
FIG. 3 is the structure of FIG. 2 after a partial-cutting process.

Referring now to FIG. 3, therein is shown the structure of FIG. 2 after a partial-cutting process. The circuit substrate 202 and the nonconductive cover 208 can be cut using a blade (not shown). The partial-cutting process can have the blade form a separation-gap 302 in the circuit substrate 202, the nonconductive cover 208, or a combination thereof. The separation-gap 302 can be made in the device separation portion 204 of FIG. 2. The separation-gap 302 can be between groups of the die connectors 104.

The separation-gap 302 can have a kerf depth 304 and a kerf width 306. The kerf depth 304 is defined as a measure of the separation-gap 302 in the vertical direction. The kerf depth 304 can be measured from the cover surface 210 down into a surface on a portion of the circuit substrate 202 where the separation-gap 302 stops.

The separation-gap 302 can also have a length (not shown) that extends in a straight line across the circuit substrate 202. Also, the circuit substrate 202 can have multiple instances of the separation-gap 302. The instances of the separation-gap 302 can cross each other at an angle, including at a right angle. The instances of the separation-gap 302 can be used to form isolated portions of the circuit substrate 202, rectangular stand-off like portions for example, extending upward from the inactive portion 206.

The kerf depth 304 can be predetermined to have the separation-gap 302 extend through the active side 112 and leave a surface between the active side 112 and the side opposite to the active side 112. The separation-gap 302 can be above, extend up to, or extend into the inactive portion 206.

The kerf width 306 is defined as the measure of the separation-gap 302 in the horizontal direction. The kerf width 306 can depend on the thickness of the blade used to create the separation-gap 302. The kerf width can be 30 micro-meters or less.

It has been discovered that the nonconductive cover 208 attached to the active side 112 of FIG. 1 of the circuit substrate 202 provide improved protection to the low-dielectric layer within the circuit substrate 202. The nonconductive cover 208 can provide the improved protection by providing support, such as in structural or chemical, to the low-dielectric layer of the circuit substrate 202 during the formation of the separation-gap 302 through the partial-cutting process.

It has further been discovered that the nonconductive cover 208 attached to the active side 112 of the circuit substrate 202 can simplify manufacturing and lower manufacturing cost. The nonconductive cover 208 can simplify manufacturing and reduce the cost by allowing a blade to form the separation-gap 302 instead of laser grooving, which applies laser to heat and melt the material then remove the melted portions.

It has yet further been discovered that the circuit substrate 202 having the separation-gap 302 reduces stress related damages to resulting devices. The circuit substrate 202 having the separation-gap 302 reduces stress related damages by reducing the amount of torque applied to the active side 112 of FIG. 1 during manufacturing process. The separation-gap 302 creates isolations which can transfer the stress and torque applied to the circuit substrate 202 from the active side 112 to the remaining portions of the circuit substrate 202.

Figure 4:
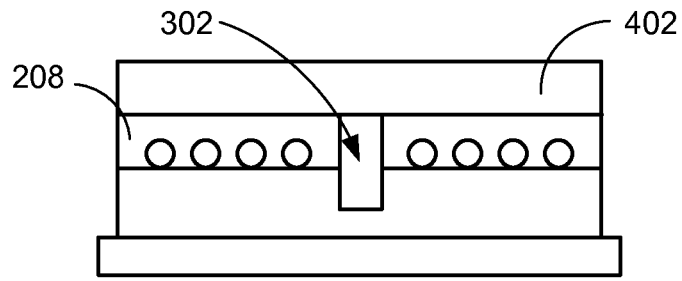
FIG. 4 is the structure of FIG. 3 after attaching a back-grinding tape.

Referring now to FIG. 4, therein is shown the structure of FIG. 3 after attaching a back-grinding tape 402. The back-grinding tape 402 can be attached to the cover surface 210 of FIG. 2. The back-grinding tape 402 can extend over and cover the top portion of the separation-gap 302.

The back-grinding tape 402 can provide support for the circuit substrate 202 of FIG. 2. The back-grinding tape 402 can hold the circuit substrate 202 in place for further manufacturing process. The back-grinding tape 402 can also protect the active side 112 of FIG. 2, the nonconductive cover 208 of FIG. 2, the die connectors 104 of FIG. 2, or a combination thereof from contamination.

It has been discovered that the nonconductive cover 208 having the cover surface 210 provide reliability in manufacturing leading to reduced damage to the circuit substrate 202. The nonconductive cover 208 having the cover surface 210 provides reliability by improving bond strength between the back-grinding tape 402 and ultimately the circuit substrate 202 through the nonconductive cover 208. The improved bond strength can reinforce the correct placement and manipulation of the circuit substrate 202 during manufacturing.

It has further been discovered that the cover surface 210 reduces air voids between the nonconductive cover 208 and the back-grinding tape 402. The cover surface 210 reduces eliminates depressions with its flat and planar characteristics, which eliminates any gaps, holes, or dips where air or gases can be trapped when attaching or laminating the back-grinding tape 402 to the nonconductive cover 208.

Figure 5:
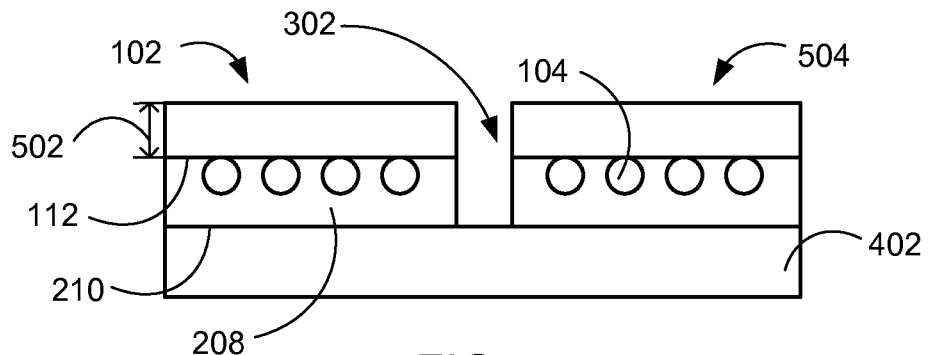
FIG. 5 is the structure of FIG. 4 after a back-grinding process.

Referring now to FIG. 5, therein is shown the structure of FIG. 4 after a back-grinding process. The structures in FIG. 5 are shown having been vertically flipped relative to FIG. 4. For example, the back-grinding tape 402 can be on the bottom and the active side 112 can face down.

The inactive portion 206 of FIG. 2 of the circuit substrate 202 of FIG. 2 or a portion thereof can be removed through the back-grinding process. The back-grinding process can include cleaning, surface lamination, grinding with a grinding wheel, chemical etching, washing, polishing, or a combination thereof.

The back-grinding process can be done to a desired depth to remove a portion of the inactive portion in the circuit substrate 202. The back-grinding process can leave the resulting structures having a chip thickness 502. The chip thickness 502 is defined as a measure of a dimension on the circuit substrate 202 in a direction perpendicular to the active side 112, from the active side 112 to the passive side 114 of FIG. 1.

For illustrative purposes, the circuit substrate 202 is shown having the inactive portion 206 completely removed from the back-grinding process. However, it is understood that some of the inactive portion 206 can remain after the back grinding process.

With the inactive portion 206 removed, the circuit substrate 202 can be left with isolated devices. For example, back-grinding the circuit substrate 202 can result in forming the integrated circuit die 102 and a separated die 504. The integrated circuit die 102 and the separated die 504 can have the separation and isolation created by the separation-gap 302 in between the two devices. The separated die 504 can be identical or similar to the integrated circuit die 102.

From the perspective of the integrated circuit die 102, the back-grinding process can decrease the distance between the active side 112 and the passive side 114. The chip thickness 502 can be measured from the active side 112 to the passive side 114. The back grinding process can be controlled to remove a desired amount of the circuit substrate 202 for controlling the chip thickness 502. For example, the back grinding process can manufacture the circuit substrate 202 having the chip thickness 502 of 200 micro meters or less.

It has been discovered that having the nonconductive cover 208 and the back-grinding tape 402 reduces the amount of damage, leading to reduction in failing units. The nonconductive cover 208 and the back-grinding tape 402 reduces the amount of damage by covering the active side 112, the die connectors 104, or a combination thereof to protect from physical damage or abrasions and contamination during the back grinding process.

It has further been discovered that the nonconductive cover 208 having the cover surface 210 provides increased reliability in producing ultra-thin wafers, especially having the chip thickness 502 of 75 micro meters or less. The cover surface 210 provides the increased reliability by providing increased bond strength with the back-grinding tape 402 while maintaining a flat planar surface.

It has yet further been discovered that the nonconductive cover 208 having the cover surface 210 and the back-grinding tape 402 increases the yield for manufacturing the integrated circuit die 102. The cover surface 210 can increase the yield by providing a flat surface for resting the circuit substrate 202 during the back grinding process. The flat surface can reduce the vibration experienced by the circuit substrate 202 during the back grinding process, which can reduce the number of dies flying out after the back grinding process.

It has also been discovered that the nonconductive cover 208 and the back-grinding tape 402 increases the availability of back grinding flip chip bumped wafers and reduces the cost and complexity for creating ultra-thin flip chips. The nonconductive cover 208 and the back-grinding tape 402 increases the availability and reduces the cost and complexity by providing a flat surface above the die connectors 104, which reduces the vibration as discussed above.

Figure 6:
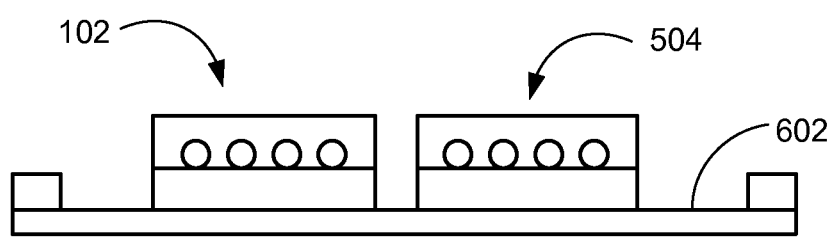
FIG. 6 is the structures of FIG. 5 after attaching to a dicing tape and removing the back-grinding tape of FIG. 5.

Referring now to FIG. 6, therein is shown the structures of FIG. 5 after attaching to a dicing tape 602 and after removing the back-grinding tape 402 of FIG. 5. The structures shown in FIG. 6 are vertically flipped from the orientation shown in FIG. 5. For example, the cover surface 210 of FIG. 5 can be exposed at the top of the structures and the passive side 114 of FIG. 1 can be on the bottom and attached to the dicing tape 602.

The dicing tape 602 is defined as a structure for holding and manipulating the integrated circuit die 102, the separated die 504, or a combination thereof during a back-grinding process. The dicing tape 602 can attach to the integrated circuit die 102, the separated die 504, or a combination thereof.

If the resulting structures, such as the integrated circuit die 102, the separated die 504, or a combination thereof, are not completely separated after the back grinding process, the dicing tape 602 can hold the circuit substrate 202 of FIG. 2 in place for a further dicing process. The remaining portions of the circuit substrate 202 between the integrated circuit die 102, the separated die 504, or a combination thereof can be cut with a blade, chemically etched, or a combination thereof to fully isolate the individual die structures.

The dicing tape 602 can also be stretched to increase the distance between the integrated circuit die 102, the separated die 504, or a combination thereof. The end portions of the dicing tape 602 can be pulled away from each other to create the separation. The increased separation can be used to further aide in locating and accessing the individual dies and in fully isolating the die structures.

It has been discovered that the nonconductive cover 208 of FIG. 5 having the cover surface 210 provides increased protection for the active side 112 of FIG. 1, the die connectors 104 of FIG. 1, or a combination thereof during the removal of the back-grinding tape 402 of FIG. 4. The nonconductive cover 208 having the cover surface 210 provides increased protection by providing added layer covering the active side 112 of FIG. 5, the die connectors 104, or a combination thereof. The cover surface 210 further increases the protection by enabling a clean separation, where no portion of the nonconductive cover 208 is removed along with the back-grinding tape 402.

Figure 7:
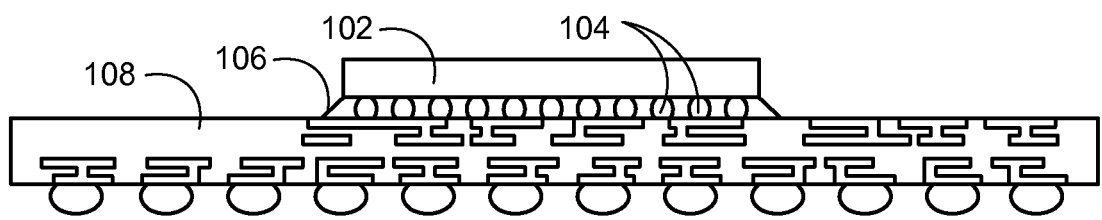
FIG. 7 is the integrated circuit die of FIG. 6 mounted on the substrate to form the integrated circuit packaging system of FIG. 1.

Referring now to FIG. 7, therein is shown the integrated circuit die 102 of FIG. 6 mounted on the substrate 108 to form the integrated circuit packaging system 100 of FIG. 1. After the integrated circuit die 102 is completely isolated from the separated die 504 of FIG. 6, the integrated circuit die 102 can be removed from the dicing tape 602 of FIG. 6. The integrated circuit die 102 can be aligned over the substrate 108 using the edges of the integrated circuit die 102, the locations of the die connectors 104 relative to the portions of the substrate 108, or a combination thereof.

The nonconductive cover 208 of FIG. 2 can be attached on to the substrate 108. The nonconductive cover 208 can be attached by being pressed, heated, cured, softened, rolled, laminated, applied, or a combination thereof on to the surface of the substrate 108. The cover surface 210 of FIG. 2 can first contact the substrate 108 during the attaching process.

The die connectors 104 can be heated to reflow the solder material and connect to pad portions of the substrate 108. The portions of the nonconductive cover 208 remaining between the active side 112 and the substrate 108 can form the nonconductive layer 106 of FIG. 1.

After attaching, a cleaning process a cleaning process can remove excess amounts of the nonconductive cover 208 from the surfaces of the substrate 108, the integrated circuit die 102, or a combination thereof. Details regarding the alignment, attachment, and cleaning will be discussed below.

It has been discovered that the nonconductive cover 208 provides cheaper and simpler manufacturing steps and faster manufacturing speed, while reducing the possibility of voids within the non-conductive layer 106 between the integrated circuit die 102 and the substrate 108. The nonconductive cover 208 provides cheaper and simpler manufacturing steps along with other benefits by eliminating the need to apply under-fill material after placing the integrated circuit die 102 and the substrate 108. The nonconductive cover 208 can replace the under-fill material to form the non-conductive layer 106.

Figure 8:
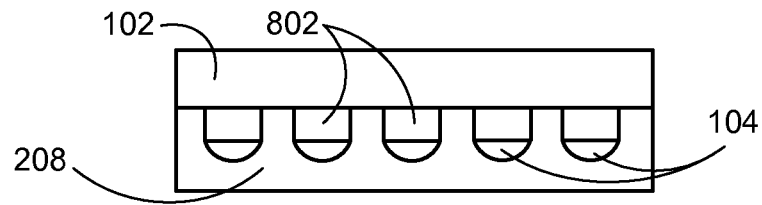
FIG. 8 is a detailed view of the structure in FIG. 6.

Referring now to FIG. 8, therein is shown a detailed view of the structure in FIG. 6. The integrated circuit die 102 can have chip pad-portions 802. The chip pad-portions 802 can be a metal connector portion on the integrated circuit die 102 that can be used to attach interconnects. The chip pad-portions 802 can have the die connectors 104 attached thereon. The chip pad-portion 802 can be completely enclosed by the die connectors 104 and the nonconductive cover 208.

Figure 9:
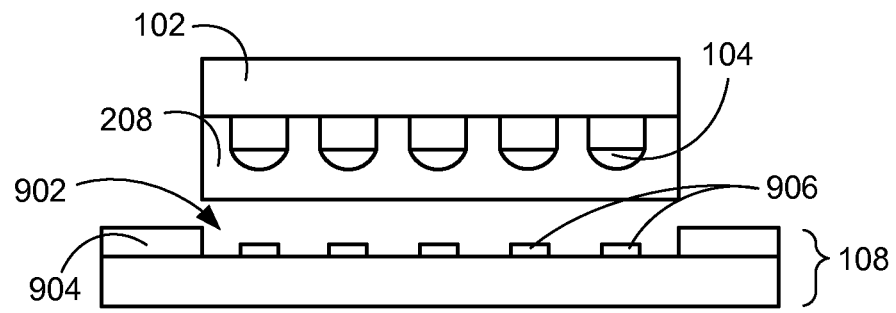
FIG. 9 is a detailed view of the structure in FIG. 8 above the substrate in a mounting step.

Referring now to FIG. 9, therein is shown a detailed view of the structure in FIG. 8 above the substrate in a mounting step. The integrated circuit die 102 can be placed above the substrate 108 prior to the mounting step. The integrated circuit die 102 can be placed directly above a substrate-cavity 902. The substrate-cavity 902 can be a depression in the substrate 108 for placing the integrated circuit die 102 therein.

The substrate 108 can have surface masks 904 on the top surface of the substrate 108. The substrate-cavity 902 can be defined by the surface masks 904. The surface masks 904 can be the portion or layer of the substrate that has a vertical or angular wall for outlining the substrate-cavity 902. The surface masks 904 can be a top layer having a hole for creating the substrate-cavity 902. The surface masks 904 can also be attached structures for creating the substrate-cavity 902.

The integrated circuit die 102 can be positioned horizontally relative to the substrate 108 while above the substrate 108 and prior to the mounting step. The integrated circuit die 102 can be positioned relative to an edge of the integrated circuit die 102, an edge of the nonconductive cover 208, the surface masks 904, the substrate-cavity 902, or a combination thereof.

For example, the edges of the integrated circuit die 102 can be coplanar with the edges of the nonconductive cover 208. The edges of the integrated circuit die 102 and the nonconductive cover 208 can be aligned to the inside of the surface masks 904 to fit within the substrate-cavity 902.

The integrated circuit die 102 can also be aligned using substrate-pads 906. The substrate-pads 906 can be the metal portions of the substrate 108 used for connecting to other interconnects. The substrate-pads 906 can connect to the die connectors 104 during the mounting process and electrically couple the integrated circuit die 102 to the substrate 108.

The integrated circuit die 102 can be aligned to the position required for mounting by centering each of the die connectors 104 directly above the center of the substrate-pads 906. The transparent property of the nonconductive cover 208 can allow for assessing the vertical alignment visually.

The cover surface 210 of FIG. 2 and the exposed surface of the substrate 108 of FIG. 1 can be cleaned. The cover surface 210 and the exposed surface of the substrate 108 can be cleaned through many methods, including a plasma or a chemical cleaning process.

Figure 10:
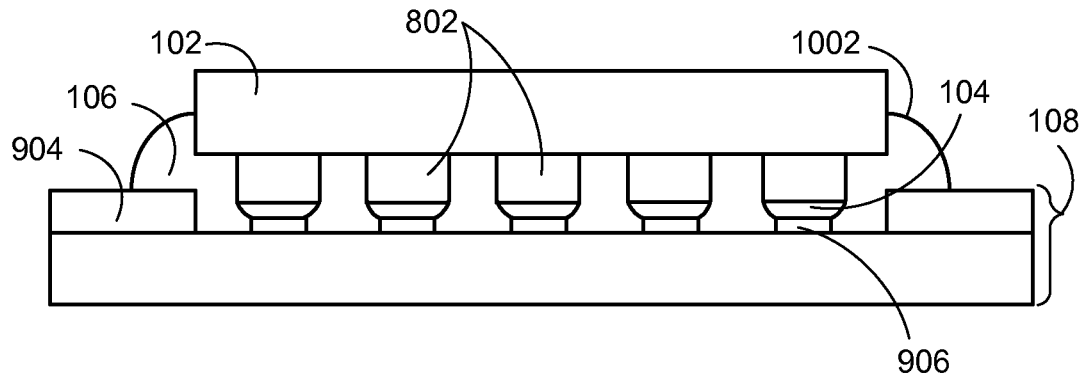
FIG. 10 is a detailed view of the integrated circuit die mounted on the substrate.

Referring now to FIG. 10, therein is shown a detailed view of the integrated circuit die 102 mounted on the substrate 108. The nonconductive cover 208 of FIG. 2 can be preheated to a temperature where the material of the nonconductive cover 208 becomes softer and can be reshaped, such as in a B-stage material, but lower than the temperature required for reshaping the die connectors 104.

The integrated circuit die 102 and the nonconductive cover 208 can be lowered into the substrate-cavity 902 of FIG. 2 while having the edges of the integrated circuit die 102 within the surface masks 904 or having the die connectors 104 directly over the substrate-pads 906. The pressure for lowering the integrated circuit die 102 can force some of the softened material of the nonconductive cover 208 to flow and squeeze out from under the integrated circuit die 102. The excess material squeezing out from under the integrated circuit die 102 can be removed.

The pressure for lowering the integrated circuit die 102 can also force the portions of the nonconductive cover 208 under the die connectors 104 to reshape the nonconductive cover 208 as the integrated circuit die 102 is lowered. The pressure can reshape the nonconductive cover 208 and decrease the amount of material between the die connectors and the substrate-pads 906 as the integrated circuit die 102 is lowered. The integrated circuit die 102 can be lowered until no portion of the nonconductive cover 208 exists between the die connectors 104 and the substrate-pads 906.

The nonconductive cover 208 can have viscosity, adhesion, and cohesion properties such that the nonconductive cover 208 does not adhere to the die connectors 104 or the substrate-pads 906 at the reshaping temperature. The properties of the nonconductive cover 208 can allow all portions of the nonconductive cover 208 between the die connectors 104 and the substrate-pad 906 to reshape and flow out to enable clean and direct contact between die connectors 104 and the substrate-pad 906.

It has been discovered that the nonconductive cover 208 having the desired viscosity, adhesion, and cohesion properties allow for the nonconductive cover 208 to flow around the die connectors 104 and allow direct contact between the die connectors 104 and the substrate-pad 906. The nonconductive cover 208 having the desired viscosity, adhesion, and cohesion properties can ensure direct contact between conductive elements with application of pressure and without additional cleaning processes.

The surface of the die connectors 104 can directly contact the surface of the substrate-pads 906 after the heating lowering process. The die connectors 104 can be further heated to the temperature required for reshaping the die connectors 104. The position of the integrated circuit die 102 can slightly be adjusted to strengthen electrical connection through the die connectors 104 and aide the reflowing process.

The heat applied to the die connectors 104, the nonconductive cover 208, or a combination thereof can be removed and the structures can be cooled. The die connectors 104 can individually attach to both the chip pad-portions 802 and the substrate-pads 906 after cooling to finish the mounting process. The resulting material of the nonconductive cover 208 remaining after the mounting process can form the non-conductive layer 106.

The non-conductive layer 106 can be more rigid and solid, such as C-stage material or cured resin, at room temperature and operating temperature of the integrated circuit die 102. The nonconductive cover 208 can become more solid with the cooling to form the non-conductive layer 106. Additional processing can be done to further solidify the nonconductive cover 208, such as applying a chemical reactant or light to the non-conductive cover 208, in forming the non-conductive layer 106.

The non-conductive layer 106 can adhere to the substrate 108, the integrated circuit die 102, or a combination thereof. The non-conductive layer 106 can also encapsulate a portion of the substrate 108, a portion of the integrated circuit die 102, the die connectors 104, or a combination thereof.

The non-conductive layer 106 can have perimeter surfaces 1002. The perimeter surfaces 1002 are defined as surfaces of the non-conductive layer 106 that not covered by the integrated circuit die 102. The perimeter surfaces 1002 can each extend down and away from the integrated circuit die 102 to the surface of the substrate 108. When the substrate 108 has the solder masks 904, the perimeter surfaces 1002 can each extend from a side surface or the active side 112 of FIG. 1 of the integrated circuit die 102 to a top surface of the solder masks 904.

Each of the perimeter surfaces 1002 can have a non-concave shape. The perimeter surfaces 1002 can each be a planar or a convex-shaped surface along each perimeter sides of the integrated circuit die 102. The perimeter surfaces 1002 can be convex-shaped, having the middle portions of the perimeter surfaces 1002 bulging out upward, away from the integrated circuit die 102, or a combination thereof.

All of the perimeter surfaces 1002 can be similar or identical to each other. The downward movement of the integrated circuit die 102 can push out the nonconductive cover 208 uniformly from under the integrated circuit die 102. The nonconductive cover 208 can maintain the similarly shaped surfaces around the perimeter of the integrated circuit die 102 during the cooling to form the perimeter surfaces 1002.

It has been discovered that the perimeter surfaces 1002 can have a non-concave shape because the non-conductive layer 106 is formed from pressing the integrated circuit die 102 having the nonconductive cover 208 attached thereon. The non-concave shape of the perimeter surfaces 1002 differs from surfaces created using capillary effects or lateral pressure to inject under-fill material between a die and a supporting structure, which have concave surfaces or non-identical surfaces surrounding the die.

It has also been discovered that the non-conductive layer 106 having the perimeter surfaces 1002 provides reduction of gaps and voids between the integrated circuit die 102 and the substrate 108. The pressing and reshaping process for forming the non-conductive layer 106 having the perimeter surfaces 1002 ensures no gaps or voids exist and uniform density exists throughout the non-conductive layer 106 without relying on the capillary effect or horizontal pressure, which can form the voids or gaps under the integrated circuit die 102.

It has further been discovered that non-conductive layer 106 having the perimeter surfaces 1002 removes spacing requirement between the integrated circuit die 102 and the substrate 108, which can simplify manufacturing steps and reduce cost. The pressing and reshaping process eliminates the reliance on the capillary effect or horizontal pressure, which both require carefully controlled separation between structures, for forming the non-conductive layer 106 between the integrated circuit die 102 and the substrate 108.

Figure 11:
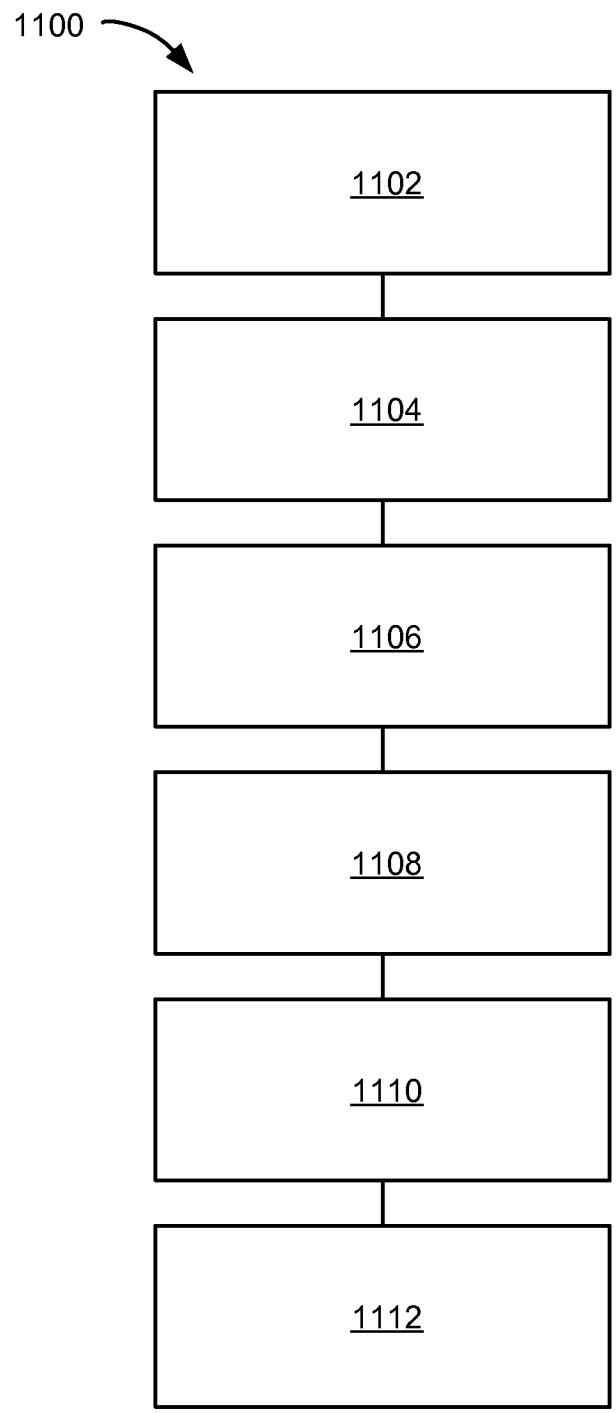
FIG. 11 is a flow chart of a method for manufacture of the integrated circuit packaging system in a further embodiment of the present invention.

Referring now to FIG. 11, therein is shown a flow chart of a method 1100 for manufacture of the integrated circuit packaging system 100 in a further embodiment of the present invention. The method 1100 includes providing a circuit substrate having an active side opposite to an inactive portion in a block 1102; attaching a nonconductive cover to the active side in a block 1104; forming a separation-gap partially cutting into the nonconductive cover and the circuit substrate to a kerf depth in a block 1106; attaching a back-grinding tape to the nonconductive cover in a block 1108; removing a portion of the inactive portion in a block 1110; and exposing the nonconductive cover by removing the back-grinding tape in a block 1112.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a circuit substrate having an active side opposite to an inactive portion;
   attaching a nonconductive cover to the active side;
   forming a separation-gap partially cutting into the nonconductive cover and the circuit substrate to a kerf depth;
   attaching a back-grinding tape to the nonconductive cover;
   removing a portion of the inactive portion;
   exposing the nonconductive cover by removing the back-grinding tape; and
   mounting the circuit substrate and the nonconductive cover over a substrate with the nonconductive cover between the substrate and the active side, wherein mounting the circuit substrate includes:
   positioning the circuit substrate over the substrate;
   heating the nonconductive cover;
   pressing the circuit substrate on to the substrate;
   reshaping the nonconductive cover; and
   removing portions of the nonconductive cover off of the substrate.

2. The method as claimed in claim 1 wherein:
   providing the circuit substrate includes attaching a die connector over the active side; and
   attaching the nonconductive cover includes enclosing the die connector within the nonconductive cover.

3. The method as claimed in claim 1 wherein attaching the nonconductive cover includes applying a nonconductive paste.

4. The method as claimed in claim 1 wherein attaching the nonconductive cover includes laminating a nonconductive film.

5. The method as claimed in claim 1 wherein attaching the nonconductive cover includes softening the nonconductive cover with heat.

6. The method as claimed in claim 1 wherein mounting the circuit substrate includes forming a nonconductive layer between the substrate and the active side from the nonconductive cover.

7. The method as claimed in claim 1 wherein removing the inactive portion includes grinding the inactive portion off the circuit substrate.

8. The method as claimed in claim 1 further comprising separating portions of the circuit substrate after the inactive portion has been removed.

9. A method of manufacture of an integrated circuit packaging system comprising:
- providing a circuit substrate having an active side opposite to an inactive portion, and a die connector coupled to the active side;
- attaching a nonconductive cover having a cover surface to the active side with the cover surface opposing the active side;
- cutting through the nonconductive cover and the circuit substrate to form a separation-gap having a kerf depth;
- attaching a back-grinding tape to the cover surface and the separation-gap;
- removing the inactive portion to form an integrated circuit die from portions of the circuit substrate forming the separation-gap;
- removing the back-grinding tape; and
- mounting the integrated circuit die and the nonconductive cover over a substrate with the nonconductive cover between the substrate and the active side, wherein mounting the integrated circuit die includes:
  - providing the substrate having a substrate-cavity defined by surface masks and a substrate-pad within the substrate-cavity; and
  - aligning the integrated circuit die directly over the substrate-cavity using the surface masks or the die connector directly over the substrate-pad.

10. The method as claimed in claim 9 wherein mounting the integrated circuit die includes forming a nonconductive layer from the nonconductive cover between the substrate and the active side of the integrated circuit die.

11. The method as claimed in claim 9 wherein:
- attaching the nonconductive cover includes forming the cover surface parallel to and above the active side; and
- attaching the back-grinding tape includes forming a planar surface opposite to the nonconductive cover and parallel to the active side.

12. A method of manufacture of an integrated circuit packaging system comprising:
- providing a circuit substrate having an active side opposite to an inactive portion;
- attaching a nonconductive cover having a cover surface to the active side with the cover surface opposing the active side, the nonconductive cover of transparent material;
- cutting through the nonconductive cover and the circuit substrate to form a separation-gap having a kerf depth;
- attaching a back-grinding tape to the cover surface and the separation-gap;
- removing the inactive portion to form an integrated circuit die from portions of the circuit substrate forming the separation-gap;
- removing the back-grinding tape; and
- mounting the integrated circuit die and the nonconductive cover over a substrate with the nonconductive cover between the substrate and the active side, including aligning the integrated circuit die based on details on the active side observed through the nonconductive cover.

13. The method as claimed in claim 12 wherein mounting the integrated circuit die includes forming a nonconductive layer from the nonconductive cover between the substrate and the active side of the integrated circuit die.

14. The method as claimed in claim 12 wherein:
- attaching the nonconductive cover includes forming the cover surface parallel to and above the active side; and
- attaching the back-grinding tape includes forming a planar surface opposite to the nonconductive cover and parallel to the active side.

\* \* \* \* \*